United States Patent
Taylor

(10) Patent No.: US 7,512,862 B1
(45) Date of Patent: Mar. 31, 2009

(54) COMPRESSION OF DATA FOR PROTECTION

(75) Inventor: James A. Taylor, Livermore, CA (US)

(73) Assignee: Network Appliance, Inc., Sunnyvale, CA (US)

( * ) Notice: Subject to any disclaimer, the term of this patent is extended or adjusted under 35 U.S.C. 154(b) by 643 days.

(21) Appl. No.: 11/106,170

(22) Filed: Apr. 13, 2005

(51) Int. Cl.
*H03M 13/00* (2006.01)

(52) U.S. Cl. .................. 714/755; 711/114; 710/68; 702/189; 707/200

(58) Field of Classification Search .................. 714/755, 714/758, 766; 702/189; 711/114; 710/68; 707/200
See application file for complete search history.

(56) References Cited

U.S. PATENT DOCUMENTS

| | | | | |
|---|---|---|---|---|
| 5,652,857 | A * | 7/1997 | Shimoi et al. | 711/113 |
| 5,774,715 | A | 6/1998 | Madany | |
| 5,778,411 | A * | 7/1998 | DeMoss et al. | 711/4 |
| 6,327,671 | B1 * | 12/2001 | Menon | 714/6 |
| 6,732,230 | B1 * | 5/2004 | Johnson et al. | 711/114 |
| 6,968,441 | B1 * | 11/2005 | Schnee | 711/173 |
| 2003/0041211 | A1 * | 2/2003 | Merkey et al. | 711/114 |

OTHER PUBLICATIONS

Chris Leuth, "NetApp® Data Protection: Double Parity RAID for Enhanced Data Protection with RAID-DP™," Technical Report, Network Appliance, TR3298, 10 pgs. (Oct. 2004).

* cited by examiner

*Primary Examiner*—Guy J Lamarre
(74) *Attorney, Agent, or Firm*—Blakely, Sokoloff, Taylor & Zafman LLP

(57) ABSTRACT

A storage system, such as a file server, receives a request to perform a write operation that affects a data block. In response, the storage system determines if the data block may be compressed to fit inside a redundancy block for protection. If the data block may be sufficiently compressed, the data block is written to the storage device and the compressed version of the data block is written to the protection block. If the data block may not be sufficiently compressed, the data block is written to the storage device and another data protection scheme, e.g. parity, is used to protect the data. A map, checksum and/or other tracking technique is used to associate stripes of data with the protection scheme used to protect data in the stripe.

14 Claims, 14 Drawing Sheets

RAID-4

RAID-5

RAID-6

RAID-DP

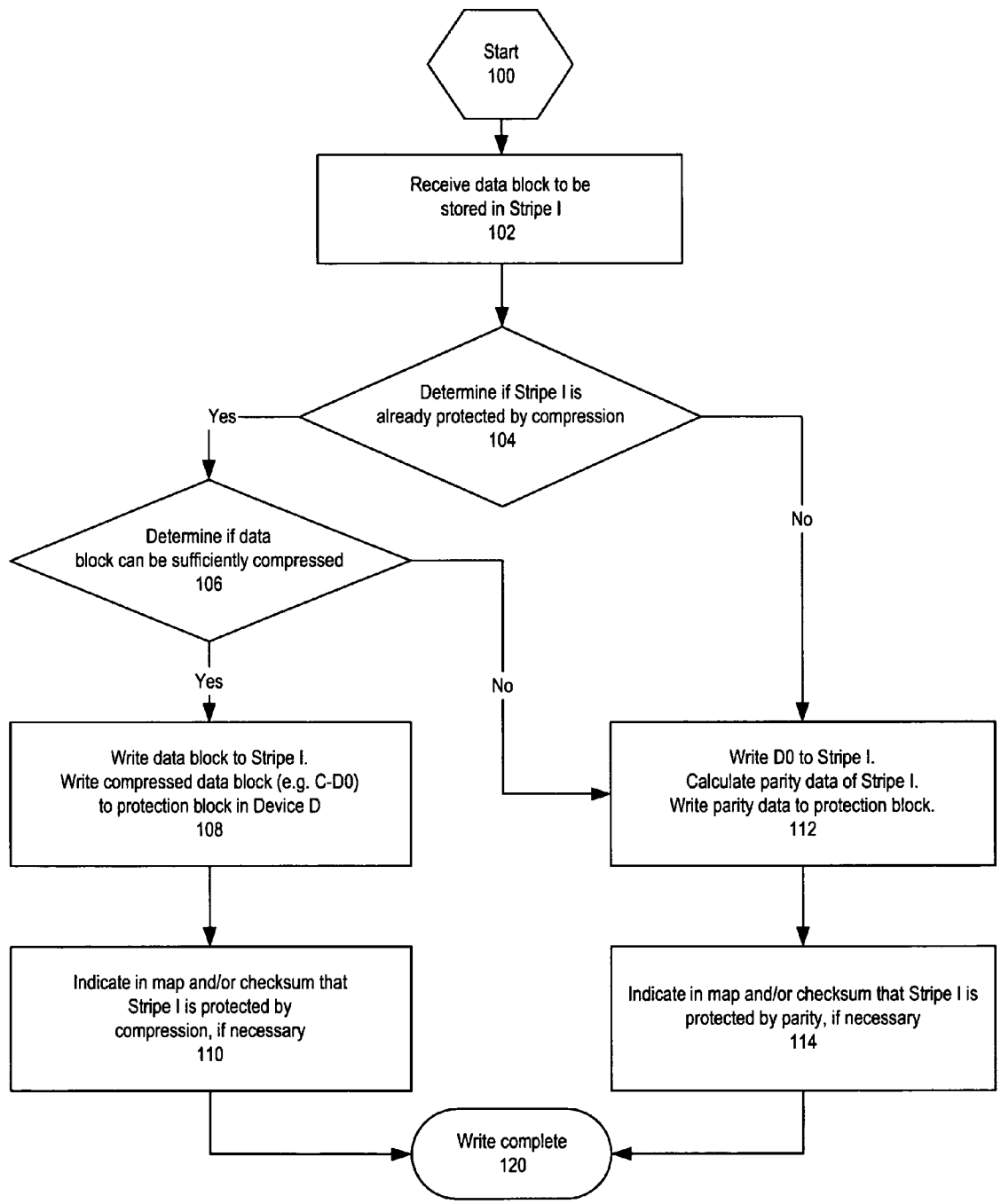

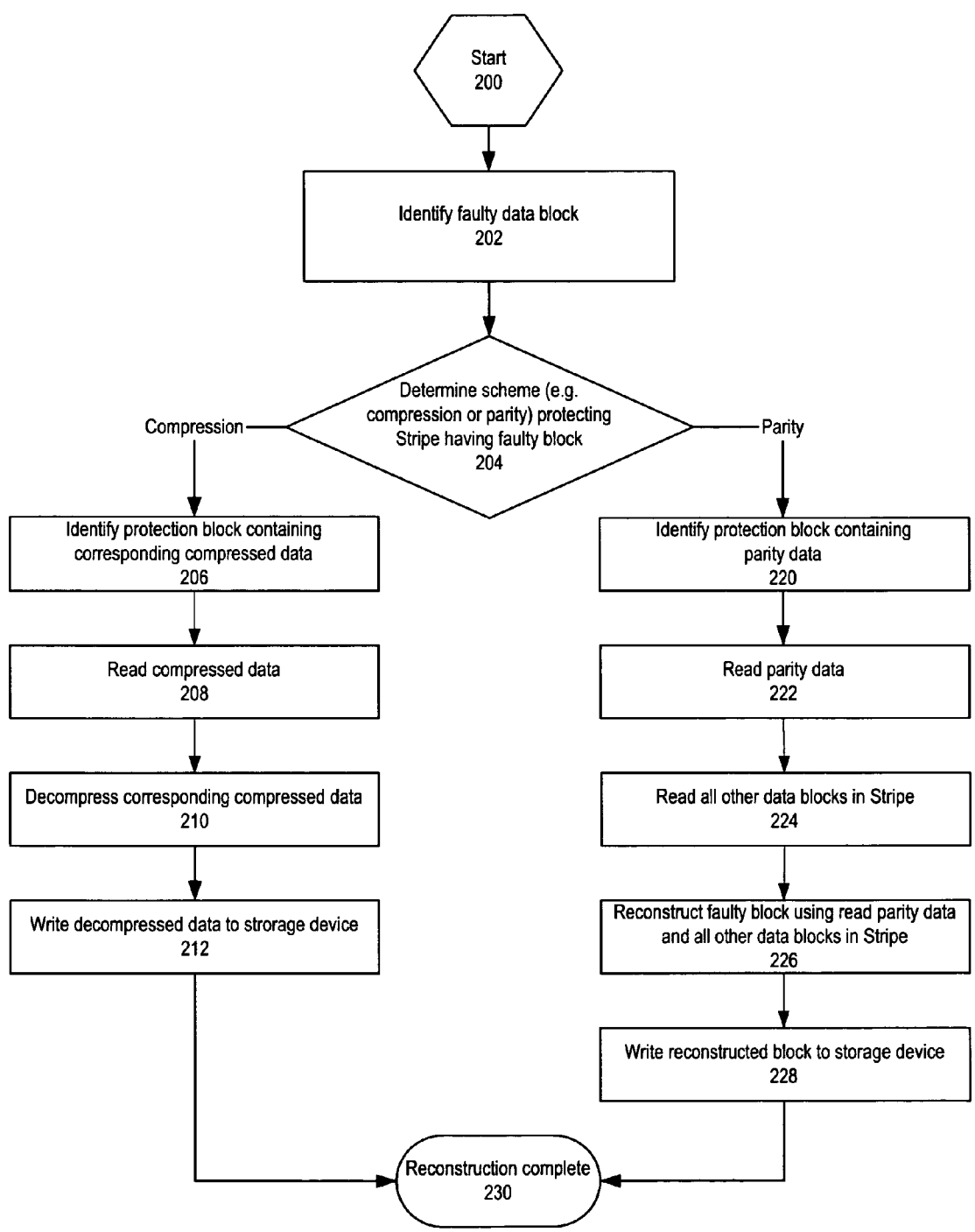

COMPRESSION OF DATA FOR PROTECTION

FIELD OF THE INVENTION

At least one embodiment of the present invention pertains to storage systems, and more particularly, to protecting data stored in a storage system using compression.

BACKGROUND

A storage server is a special-purpose processing system used to store and retrieve data on behalf of one or more client processing systems ("clients"). A storage server can be used for many different purposes, such as to provide multiple users with access to shared data or to backup mission critical data.

One example of a storage server is a file server. A file server operates on behalf of one or more clients to store and manage shared files in a set of mass storage devices, such as magnetic or optical storage based disks or tapes. The mass storage devices may be organized into one or more volumes of Redundant Array of Inexpensive Disks (RAID), sometimes known as "Redundant Array of Independent Disks." Another example of a storage server is a device which provides clients with block-level access to stored data, rather than file-level access, or a device which provides clients with both file-level access and block-level access.

In a large scale storage system, it is inevitable that data will become corrupted from time to time. Consequently, virtually all modern storage servers implement techniques for protecting the stored data. Currently, these techniques involve calculating parity data and storing the parity data in various locations. For example, each parity datum may be an exclusive-OR (XOR) of data blocks. The data blocks may be stored in a "stripe" spread across multiple disks in an array. In a single parity scheme, e.g. RAID-4 or RAID-5, each stripe of data is protected by a single parity datum. Accordingly, each data block in the stripe is protected by a single parity datum. In a dual parity scheme, e.g. RAID-6 or RAID Double Parity (RAID-DP), a technique invented by Network Appliance Inc. of Sunnyvale, Calif., each data block is protected by two parity datum. The second parity datum may be a mirror of the first parity datum or a XOR of a different set of data blocks, for example.

The parity protection schemes described above provide some data protection yet have several disadvantages. For example, in the above schemes, Write operations have significant overhead. In RAID-5 schemes, for example, small writes often require two reads and two writes. For example, under one RAID-5 scheme, an existing parity block is read. An existing data block where the new data is to be written is also read. The existing parity block and existing data block are XOR'ed, and the result XOR'ed with the new data to arrive at a new parity. The new data and the new parity are written to the storage devices. Thus, two reads (one of the existing parity block and one of the existing data block) and two writes (one of the new data and one of the new parity) are required. This process is sometimes referred to as "Read Modify Write." While the two Read operations may be done in parallel, as can the two Write operations, modifying a block of data in a RAID 5 system may still take substantially longer than in a system which would not require a preliminary Read operation. In some systems, the preliminary Read operation requires the system to wait for the storage devices (e.g. disk drives) to rotate back to a previous position before performing the Write operation. The rotational latency time alone can amount to about 50% of the time required for a data modification operation. Further, two disk storage units are involved for the duration of each data modification operation, limiting the performance of the system as a whole.

To avoid reading before writing under a RAID-5 scheme, an entire stripe has to be written, including the recalculated parity. This process is sometimes referred to as "Full Stripe Write." Other write operations may read data blocks not being written (e.g. "Partial Stripe Write"). Yet others may eliminate some reads and writes of parity but still require one read and write for each data drive and one read and write for the parity drive (e.g. "Combined Read Modify Write" which writes to more than one data block in the stripe).

Additionally, under the RAID schemes described above, an array of storage devices may operate in a "degraded mode." Operation in this mode may occur when a system operates with a failed storage device. The system ignores the failure and continues to read and write to the remaining devices in the array if possible (e.g. when only one device has failed in a single drive protection scheme). Performance suffers because, when a block is read from the failed drive, all other blocks in the stripe must be read. These other blocks are used to reconstruct the faulty or missing block. All blocks on the failed drive must be reconstructed using parity data and the other data.

In the schemes above, because Writes to a failed device or member (e.g. a disk drive) require accessing to all other devices in the array, if a media failure occurs during operating in degraded mode, data may be lost. For example, if a media error occurs in a RAID-5 array operating with a failed device, the data blocks in both the failed device and the device having the media error cannot be recovered. Encountering media errors while reconstructing a failed device is a common problem with RAID-5 arrays. Therefore, although data is still available in degraded mode, the array is vulnerable to failure if one of the remaining devices fails.

Therefore, what is needed is an improved technique for protecting data in a storage system.

SUMMARY OF THE INVENTION

The present invention includes a method which includes writing a data block in a stripe and writing a compressed version of the data block to a protection block.

The invention further includes a storage system and a storage server that can perform such a method.

Other aspects of the invention will be apparent from the accompanying figures and from the detailed description which follows.

BRIEF DESCRIPTION OF THE DRAWINGS

One or more embodiments of the present invention are illustrated by way of example and not limitation in the figures of the accompanying drawings, in which like references indicate similar elements and in which:

FIG. 11 shows a flow chart of a process for writing data to storage in accordance with one embodiment of this invention; and FIG. 12 shows a flow chart of a process for recovering data in accordance with one embodiment of this invention when a storage device in an array of storage devices fails.

DETAILED DESCRIPTION

A method and apparatus for protecting data stored in a storage system are described. In certain embodiments of the invention, the method includes writing data and writing a compressed version of the data to a protection block for redundancy.

As used herein, the term "block" can mean any chunk of data which a file system is capable of recognizing and manipulating as a distinct entity. Accordingly, as used herein, "data blocks" are blocks which store data being written to the storage system and "protection blocks" are blocks which store data to protect the data stored in the data blocks. Conventionally, the only data stored in protection blocks are parity data. By contrast, embodiments of this invention store compressed versions of data blocks in the protection blocks.

The data may be striped across an array of independently accessible storage devices (e.g. hard drives). Using embodiments of this invention, the data may be written to the array without a Read before a Write. Therefore, one advantage of this technique is a reduction in the overhead for writing data to a stripe, whether for a small Write or large Write.

Other advantages to this technique include potential improvements in performance and data availability, while remaining less costly than straight data mirroring. For example, a faulty block in a stripe may be read by accessing the compressed data in the redundancy block and decompressing the data. Other drives in the stripe need not be accessed. Therefore, the compression protection scheme described herein does not suffer from the previously described "degraded mode" performance that affects other schemes (e.g. RAID-5 or RAID-6), and therefore may provide improved performance.

Additionally, because the compression protection scheme recovers data without using other data blocks in the stripe, data is protected even when two drives in the array fail, so long as neither drives contain the redundancy (or protection) block, thus providing dual drive protection. This differs from RAID-5, for example, in which data is lost when the array, operating with a failed member encounters a media error because data recovery in the RAID-5 scheme requires access to other data blocks in the stripe. Therefore, embodiments of the compression data protection scheme described herein provide improved data availability over other protection schemes.

Additionally, the compression data protection scheme described herein may be referred to as "RAID-C" (for RAID-Compression) when implemented with a RAID storage protocol, although it shall be appreciated that embodiments of the invention are equally applicable to non-RAID data protection schemes.

Moreover, the compression data protection scheme described herein may be integrated with other RAID protection schemes. FIGS. 1A-1D show arrangements of blocks for protecting data using parity which may be integrated with embodiments of this invention.

Figure 1A:
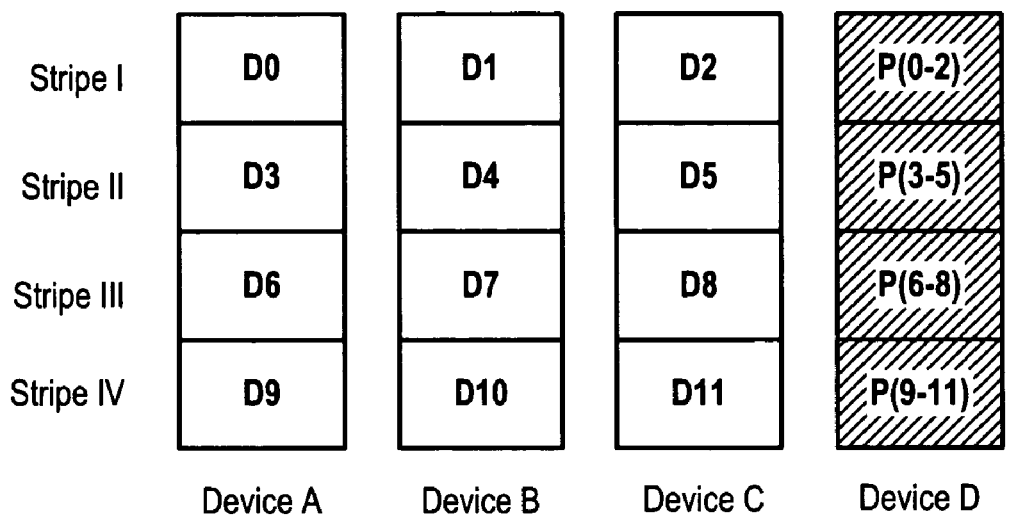
FIGS. 1A-1D show arrangements of blocks for protecting data using parity which may be integrated with embodiments of this invention.
Figure 1B:
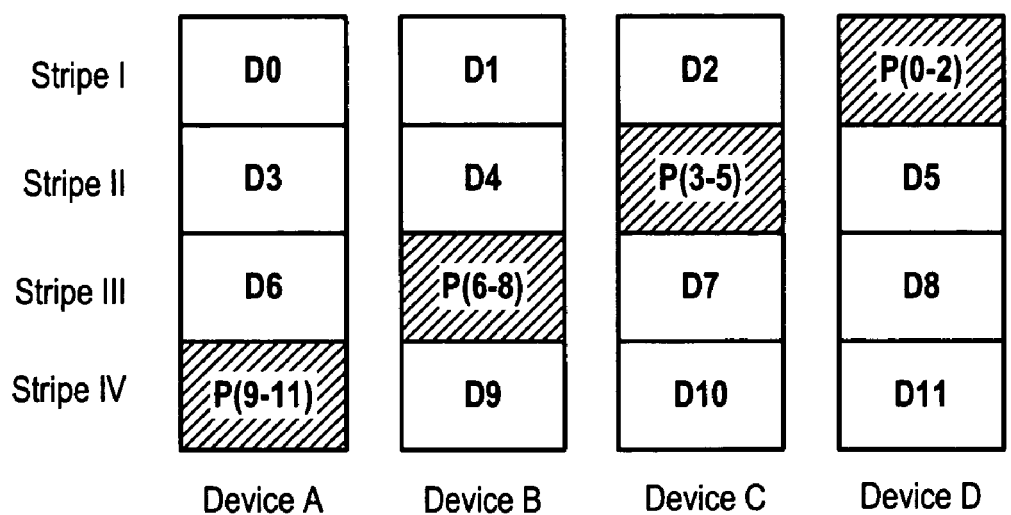

In FIGS. 1A-1D, a file sent to a file server for storage may first be broken up into 4 KByte blocks (e.g. D0, D1, etc.), which are then formed into groups that are stored in a "stripe" (e.g. Stripe I, Stripe II, etc.) spread across multiple disks in an array. Parity data, e.g. an exclusive-OR (XOR) of the data in the stripe, is calculated and stored in a protection block. The parity data, e.g. P(0-2), may be used to reconstruct a single corrupted data block in the stripe. The location of the parity data depends on the type of protection scheme or protocol implemented. FIG. 1A shows a RAID-4 scheme in which the parity data, e.g. P(0-2), P(3-5), etc., is stored in a dedicated device (Device D). FIG. 1B shows a RAID-5 scheme in which the parity data is distributed across disk members in the array. While single parity schemes, e.g. RAID-4 or RAID-5, can reconstruct a single corrupted block in the stripe using the parity data and the remaining data blocks, these single parity schemes cannot be used to recover the corrupted data block because there is not enough information to determine which disk contains the corrupted block in the stripe. Additionally, if two devices in the array fail simultaneously, data is lost.

Figure 1C:
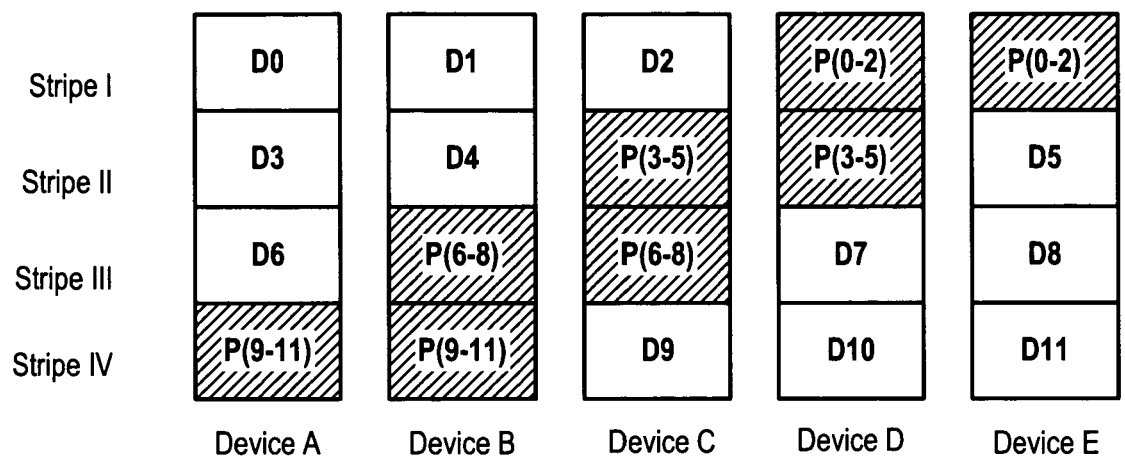
Figure 1D:
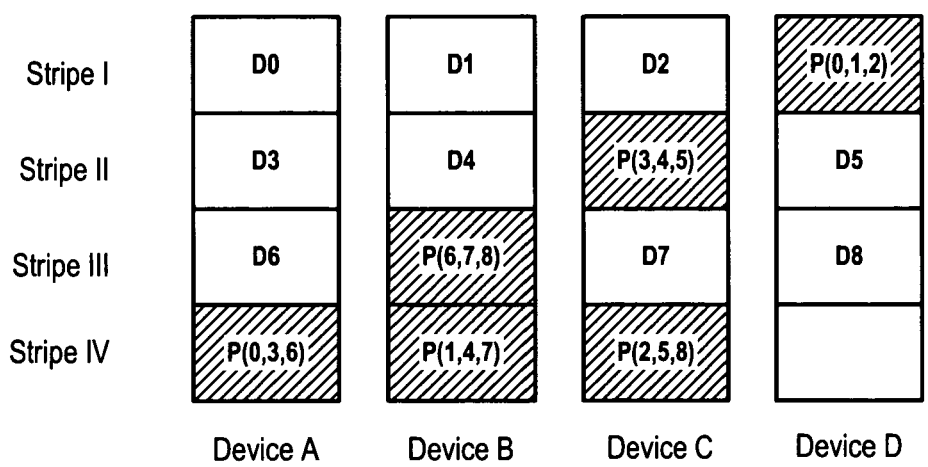

Dual parity schemes attempt to provide greater data protection. FIG. 1C shows a distribution of data and parity blocks in accordance with RAID-6. RAID-6 schemes often distribute parity data, as in RAID-5, but in addition, provide a second protection block. For example, some RAID-6 schemes mirror the parity data on a second device. As shown in FIG. 1C, the mirrored parity data is also distributed across the array. Other RAID-6 schemes may use an XOR for the first protection block, but a Reed-Soloman code for the second protection block. Yet other RAID-6 schemes may use an XOR over one set of data blocks for the first protection block, but an XOR over a different set of data blocks for the second protection block. FIG. 1D shows a distribution of data and parity blocks in accordance with RAID Double Parity (RAID-DP). RAID-DP, a technique invented by Network Appliance Inc. of Sunnyvale, Calif., also uses two distributed parity sets, as in RAID-6. However, the second parity set is calculated using a different group of blocks. For example, in FIG. 1D, a first parity set is calculated using horizontal rows of blocks (e.g. D0, D1 and D2) and a second parity set is calculated using another row of blocks (e.g. D0, D3, D6). The second parity set is often calculated using diagonal rows of blocks. Using a dual parity scheme, such as RAID-DP, data can be protected even when two devices in the array fail simultaneously.

Environments and Architecture

Figure 2:
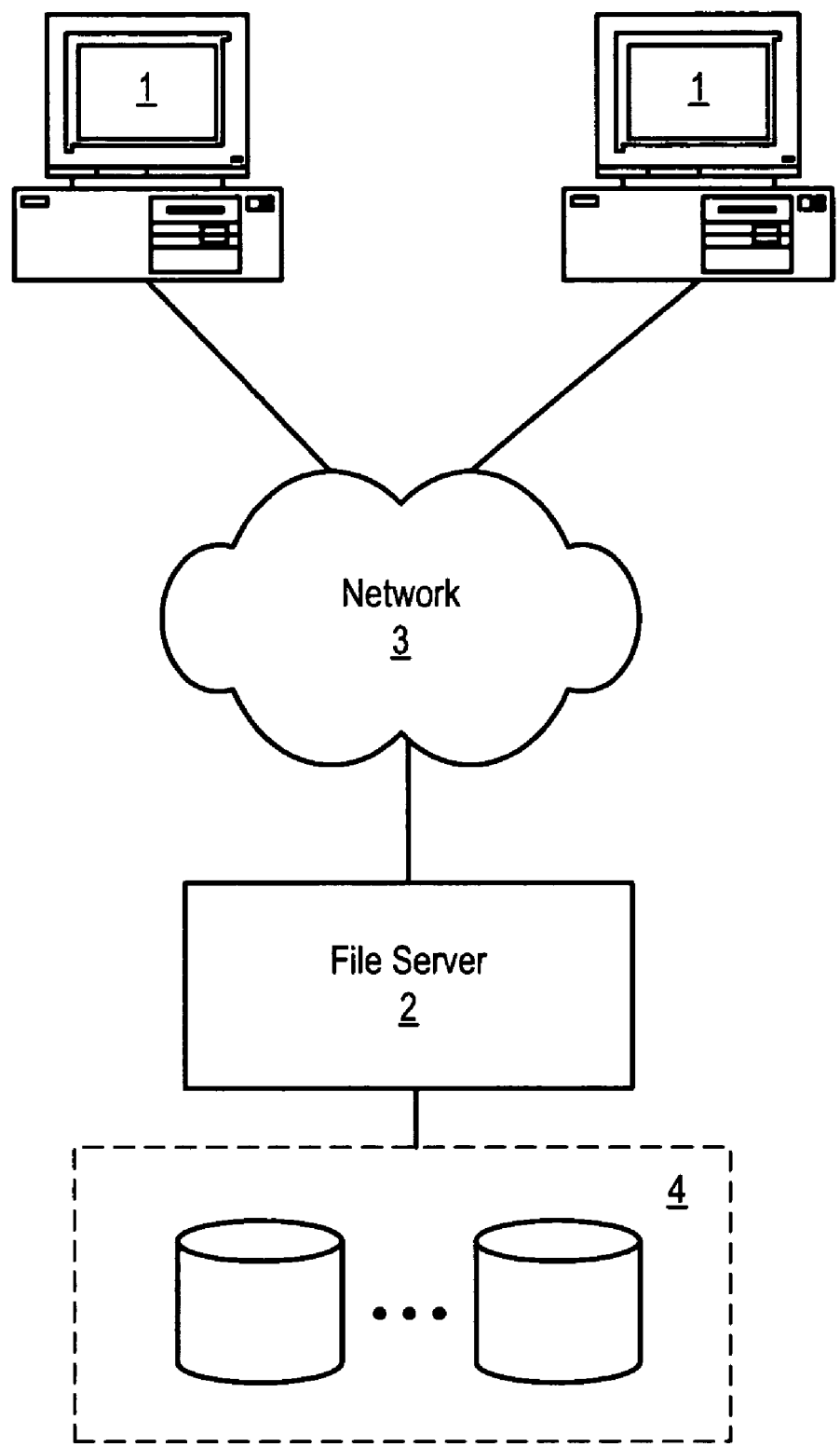
FIG. 2 shows a network environment that includes a file server which implements embodiments of the invention.

As noted, the compression data protection scheme introduced herein can be implemented in a storage server, such as a file server. FIG. 2 shows a simple example of a network environment which incorporates a file server 2. Note, however, that the compression data protection scheme introduced herein is not limited to use in traditional file servers. For example, the scheme can be adapted for use in other types of storage systems, such as storage servers which provide clients with block-level access to stored data or processing systems other than storage servers.

The file server 2 in FIG. 2 is coupled locally to a storage subsystem 4 which includes a set of mass storage devices, and to a set of clients 1 through a network 3, such as a local area network (LAN). Each of the clients 1 may be, for example, a conventional personal computer (PC), workstation, or the like. The storage subsystem 4 is managed by the file server 2. The file server 2 receives and responds to various Read and Write requests from the clients 1, directed to data stored in or to be stored in the storage subsystem 4. The mass storage devices in the storage subsystem 4 may be, for example, conventional magnetic disks, optical disks such as CD-ROM or DVD based storage, magneto-optical (MO) storage, or any other type of non-volatile storage devices suitable for storing large quantities of data.

The file server 2 may have a distributed architecture; for example, it may include a separate N- ("network") blade and D- (disk) blade (not shown). In such an embodiment, the N-blade is used to communicate with clients 1, while the D-blade includes the file system functionality and is used to communicate with the storage subsystem 4. The N-blade and D-blade communicate with each other using an internal protocol. Alternatively, the file server 2 may have an integrated architecture, where the network and data components are all contained in a single box. The file server 2 further may be coupled through a switching fabric to other similar file servers (not shown) which have their own local storage subsystems. In this way, all of the storage subsystems can form a single storage pool, to which any client of any of the file servers has access.

Figure 3:
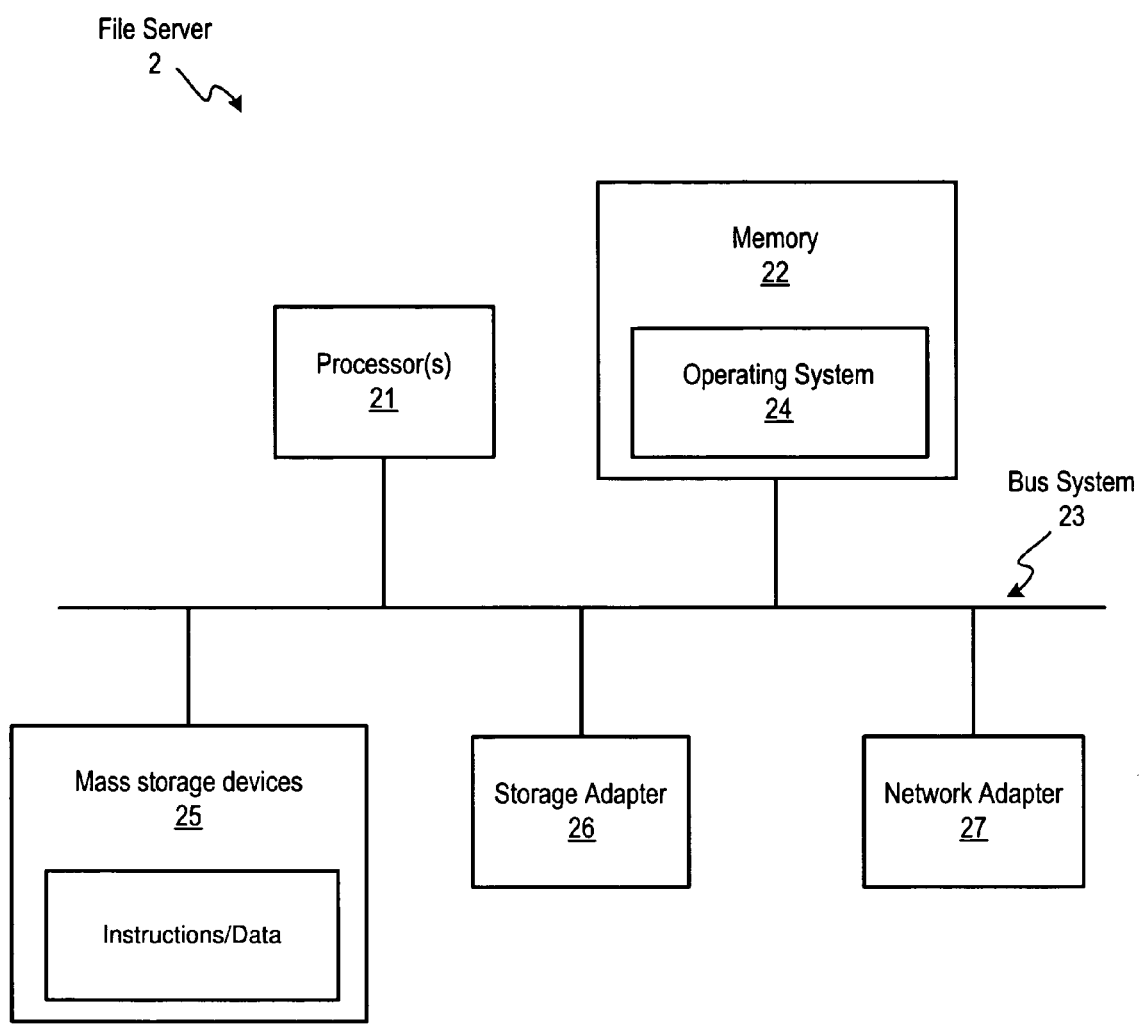
FIG. 3 is a diagram showing the architecture of a file server that can implement the invention.

FIG. 3 is a diagram showing the architecture of the file server 2, according to certain embodiments of the invention. Certain standard and well-known components which are not germane to the present invention may not be shown. The file server 2 includes one or more processor(s) 21 and memory 22 coupled to a bus system 23. The bus system 23 shown in FIG. 3 is an abstraction that represents any one or more separate physical buses and/or point-to-point connections, connected by appropriate bridges, adapters and/or controllers. The bus system 23, therefore, may include, for example, a system bus, a Peripheral Component Interconnect (PCI) bus, a Hyper-Transport or industry standard architecture (ISA) bus, a small computer system interface (SCSI) bus, a universal serial bus (USB), or an Institute of Electrical and Electronics Engineers (IEEE) standard 1394 bus (sometimes referred to as "Firewire").

The processor(s) 21 are the central processing units (CPUs) of the file server 2 and, thus, control the overall operation of the file server 2. In certain embodiments, the processor(s) 21 accomplish this by executing software stored in memory 22. A processor 21 may be, or may include, one or more programmable general-purpose or special-purpose microprocessors, digital signal processors (DSPs), programmable controllers, application specific integrated circuits (ASICs), programmable logic devices (PLDs), or the like, or a combination of such devices.

Memory 22 is or includes the main memory of the file server 2. Memory 22 represents any form of random access memory (RAM), read-only memory (ROM), flash memory, or the like, or a combination of such devices. Memory 22 stores, among other things, the operating system 24 of the file server 2, in which the compression data protection scheme above may be implemented.

Also connected to the processor(s) 21 through the bus system 23 are one or more internal mass storage devices 25, a storage adapter 26 and a network adapter 27. Internal mass storage devices 25 may be or include any conventional medium for storing large volumes of data in a non-volatile manner, such as one or more magnetic or optical based disks. The storage adapter 26 allows the file server 2 to access the storage subsystem 4 (shown in FIG. 2) and may be, for example, a Fibre Channel adapter or a SCSI adapter. The network adapter 27 provides the file server 2 with the ability to communicate with remote devices, such as the clients 1 (shown in FIG. 2), over a network and may be, for example, an Ethernet adapter.

Figure 4:
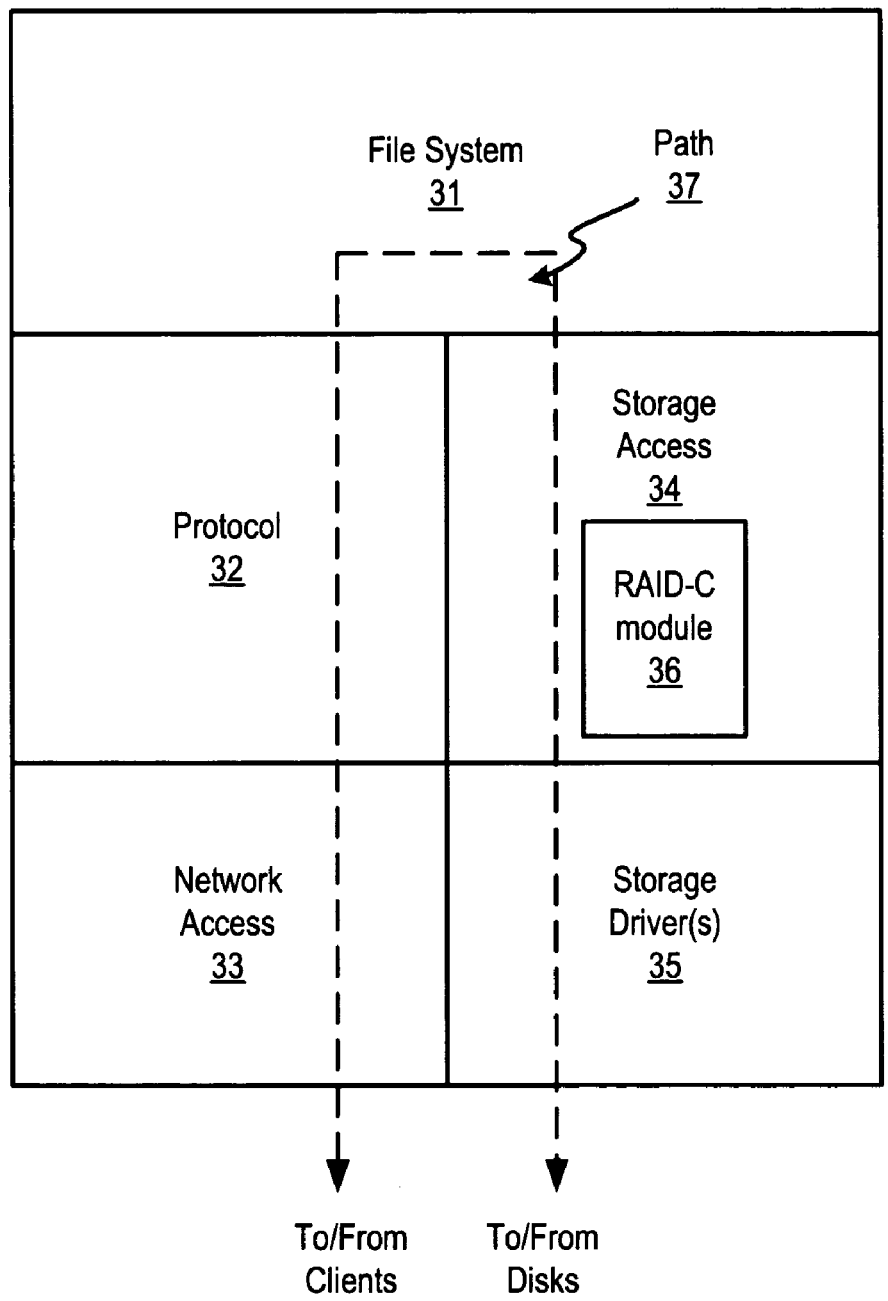
FIG. 4 is a diagram showing the operating system of a file server according to an embodiment of the invention.

FIG. 4 shows an example of the operating system 24 of the file server 2. As shown, the operating system 24 includes several modules, or "layers." These layers include a file system layer 31. The file system layer 31 includes an application-layer software that keeps track of the directory structure (hierarchy) of the data stored in the storage subsystem 4 and manages Read/Write operations on the data (i.e., executes Read/Write operations on the disks in response to client requests). Logically "under" the file system 31, the operating system 24 also includes a protocol layer 32 and an associated network access layer 33, to allow the file server 2 to communicate over the network 3 (e.g., with clients 1). The protocol layer 32 implements one or more of various higher-level network protocols, such as Network File System (NFS), Common Internet File System (CIFS), Hypertext Transfer Protocol (HTTP) and/or Transmission Control Protocol/Internet Protocol (TCP/IP). The network access layer 33 includes one or more drivers which implement one or more lower-level protocols to communicate over the network, such as Ethernet.

Also logically under the file system 31, the operating system 24 includes a storage access layer 34 and an associated storage driver layer 35, to allow the file server 2 to communicate with the storage subsystem 4. The storage access layer 34 implements a higher-level disk storage protocol, such as the compression data protection scheme introduced above. This implementation is shown in FIG. 4 by the inclusion of RAID-C module 36 in storage access layer 34. The storage driver layer 35 implements a lower-level storage device access protocol, such as Fibre Channel Protocol (FCP) or SCSI.

Also shown in FIG. 4 is the path 37 of data flow, through the operating system 24, associated with a Read or Write operation. More specifically, during a Write operation, the storage access layer 34 receives from the file system 31 a data block to be written to a device (e.g. a disk) in an array of storage devices in the storage subsystem 4. In one embodiment, the RAID-C module 36 determines whether the data block satisfies a predetermined compressibility criterion. The predetermined compressibility criterion may include one or combination of factors which allow a compressed version of the data block to be stored in the protection block. For example, the RAID-C module 36 may determine whether a size of a compressed version of the data block is less than or equal to a size of a corresponding protection (or redundancy) block. In other embodiments, the predetermined compressibility criterion may include, but is not limited to, whether a size of a compressed version of the data block is less than or equal to a fraction of a size of a corresponding protection block, whether one of a number of compression algorithms available to the module can sufficiently compress the data block to or to under a certain size, whether a stripe to which the data block is to be written is currently protected by a compression protection scheme or a parity protection scheme, or whether a stripe previously protected by a parity protection scheme may now be protected by a compression scheme. In certain embodiments, the predetermined compressibility criterion may use an algorithm to interrelate (e.g. weight) the one or combination of factors.

In certain embodiments, if the data block does satisfy the predetermined compressibility criterion, the RAID-C module 36 may then compress the data. The storage access layer 34 may then pass to the storage driver layer 35 the uncompressed data to be striped across the array of storage devices and the compressed data to be written to the protection block. In other embodiments, the RAID-C module 36 may attempt to compress the data without determining beforehand if storing a compressed version of the data in the protection block is appropriate or feasible. In those embodiments, after the data is compressed, the storage access layer may determine if the compressed data meets a predetermined compressibility criterion. In other words, determining whether a data block satisfies a predetermined compressibility criterion may occur before or after the data block is actually compressed (e.g. using hardware or software).

In certain embodiments, the uncompressed data may be passed to the storage driver layer 35 before compression is calculated, attempted or analyzed to determine whether a compression protection scheme will be used. In certain embodiments, when the data to be written cannot be adequately compressed to fit in the protection block, the stripe containing the data may revert to another protection scheme (e.g. a parity protection scheme). In such embodiments, a map may be kept to associate stripes with their corresponding protection schemes. Alternatively or in addition, a checksum area in each stripe may indicate the protection scheme used by that stripe.

The data protection technique introduced herein will now be described in greater detail. The following provides variations and examples of various aspects of embodiments of the invention. It will be appreciated that the following variations and examples are not intended to be exhaustive or to limit the invention to the precise forms disclosed. These variations and examples are to provide further understanding of embodiments of the present invention.

EXAMPLES

Figure 5:
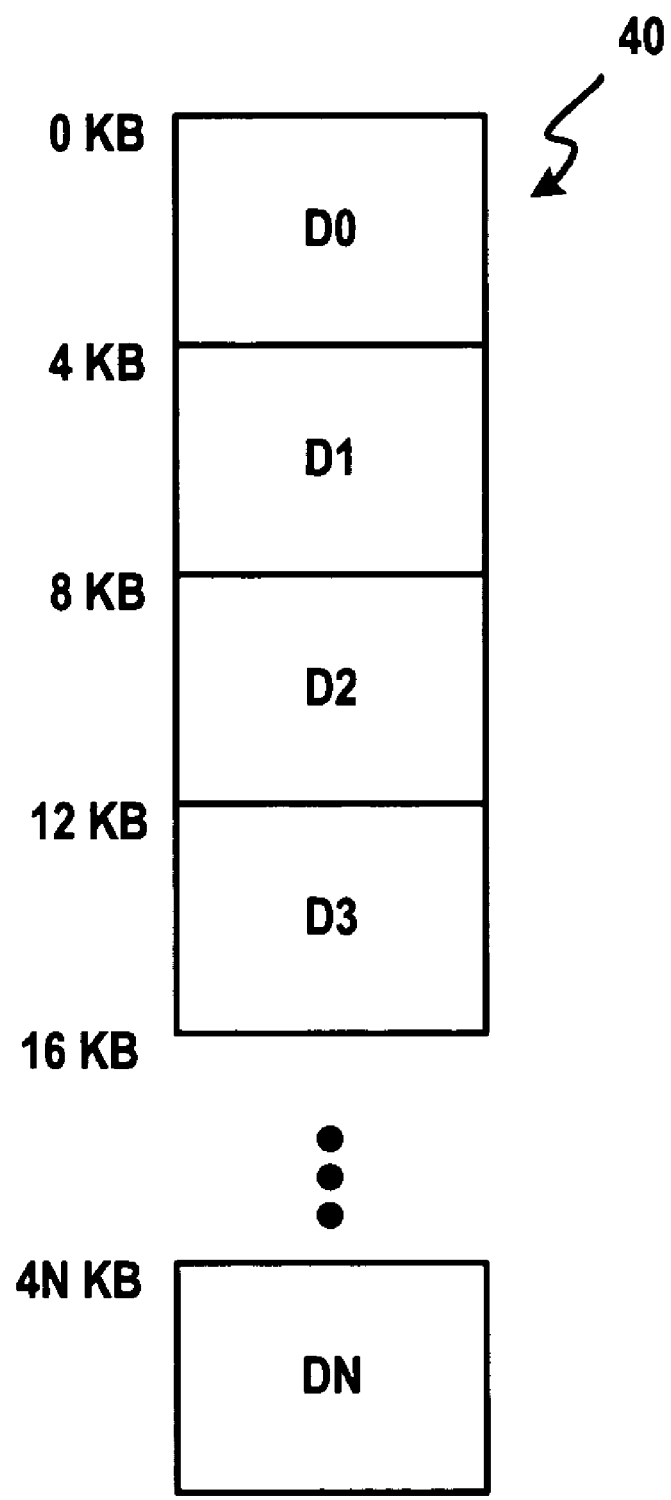
FIG. 5 illustrates how a file is broken up into blocks for storage in a storage array.

Referring to FIG. 5, each file 40 sent to the file server 2 for storage may be broken up by the file system 31 into 4 Kbyte blocks (e.g. D0 thru DN), which are then stored in a "stripe" spread across multiple disks in the storage subsystem 4. While in this description a block is described as being a 4 Kbyte chunk, in other embodiments of the invention a block may have a different size. FIGS. 6A-6B, 7A-7C and 8-10 show various arrangements of these data blocks and protection blocks used to protect the data.

Figure 6A:
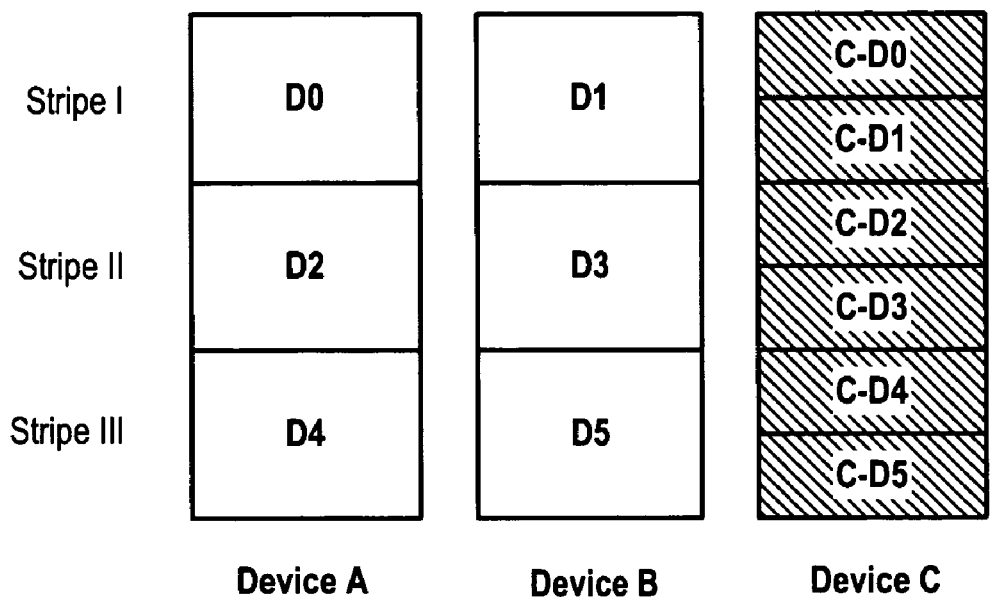
FIGS. 6A-6B show arrangements of blocks, including protection blocks in a dedicated storage device, in accordance with embodiments of the invention.

Specifically, FIGS. 6A-6B and 7A-7C show embodiments of this invention in which each stripe is associated with one protection block. FIG. 6A shows an array of three storage devices. Data blocks D0 thru D5 are striped across two of the devices. A dedicated device stores compressed versions of the data blocks, C-D0 thru C-D5. The data blocks in FIG. 6A are compressed into blocks one-half the size of the original (uncompressed) data (e.g. 2 Kbyte), or 1/(total # of storage devices-# of devices per stripe used for protection). In certain embodiments, the storage access layer 34 determines if a data block can be sufficiently compressed. In other embodiments, a different layer, e.g. file system layer 31 may make this determination. In certain embodiments, this determination is made before storing the data block in a storage device. In other embodiments, this determination is made after storing the data block. In FIG. 6A, if the block D0 can be compressed to one-half its size, then D0 and C-D0 are written. Therefore, unlike prior techniques, a Write of D0 does not require a Read of D1. Nor does a Write of D0 require a Write of the entire stripe, including D1, to avoid a Read operation. Therefore, Write overhead is reduced.

Figure 6B:
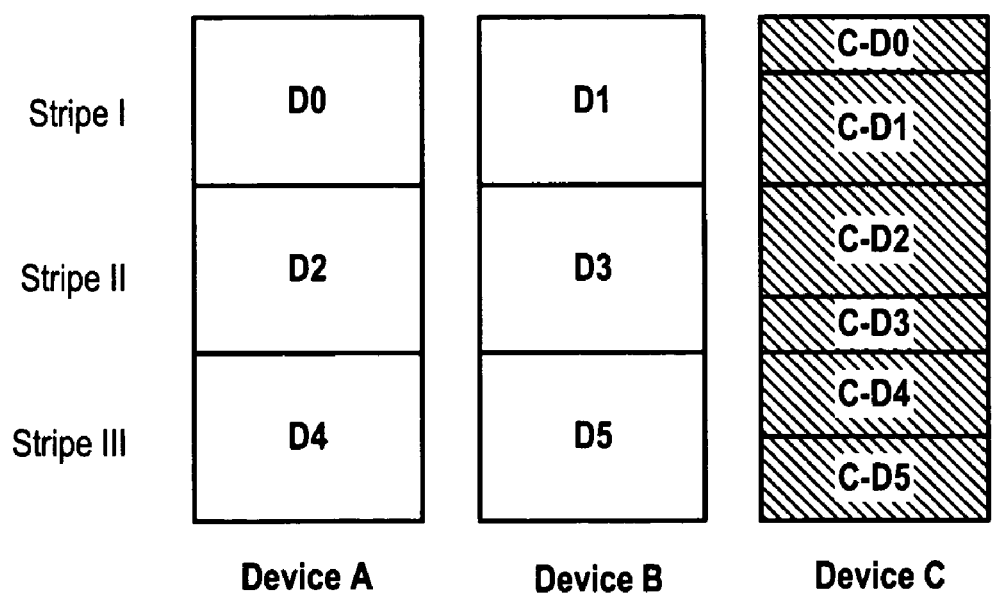

FIG. 6B also shows an array of three storage devices with data blocks D0 thru D5 striped across two of the devices and a dedicated device for compressed data blocks C-D0 thru C-D5. In FIG. 6B, however, the compressed data blocks are not necessarily the same size. For example, C-D0 is smaller than C-D1. A determination (e.g. by storage access layer 34) may have been made which indicated that D0 is more compressible than D1, such that C-D0 and C-D1 together fit into a protection block. For example, C-D0 may be 1 Kbyte and C-D1 may be 3 Kbyte, so that together they fit in a 4 Kbyte protection block. Therefore, in the embodiment of FIG. 6B, the compression data protection scheme may still be used even when a compressed version of a data block is larger than 1/(total # of storage devices-# of devices per stripe used for protection) of the protection block. This variation allows for data to be protected using a compression protection scheme more often, thereby avoiding degraded mode operations. However, this variation may also require a read of the protection block to determine the amount of space available for the compressed data. It shall be appreciated that this variation may be applied to the embodiments described in FIGS. 7A thru 10, although the variation may be not discussed in detail.

Figure 7A:
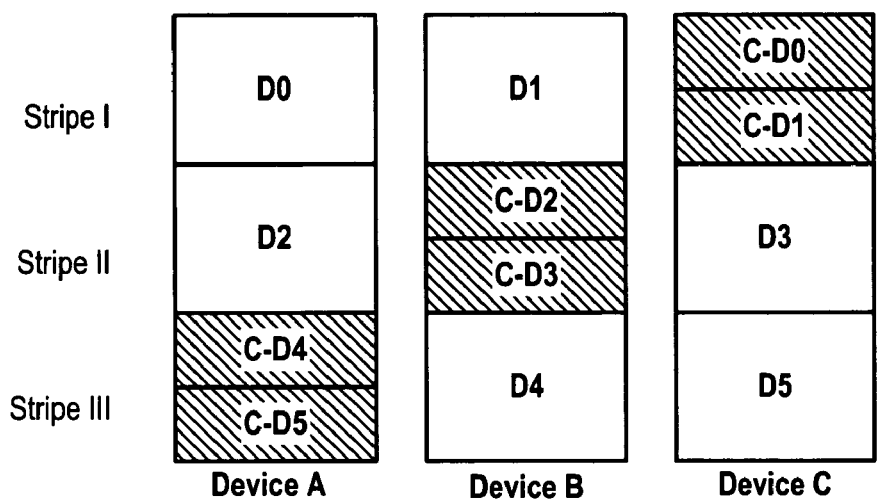
FIGS. 7A-7C show arrangements of blocks, including protection blocks distributed across arrays of varying sizes, in accordance with embodiments of the invention.

FIG. 7A also shows an array of three storage devices, Device A-Device C. Unlike in FIG. 6A or 6B, the compressed data blocks are distributed across the devices in the array. The distribution of the compression data blocks provides added protection since a failure of a device (e.g. Device C) would not equate to losing all protection blocks in the array.

In the embodiment of FIG. 7A (as well as FIGS. 6A and 6B), a write of D0 consists of writing D0 and writing C-D0 to a protection block. D1 may be accessed simultaneously during a write of D0 since the write of D0 does not operate on Device B. Additionally, if Device A fails, D0 may be reconstructed using Device C without accessing Device B. Therefore, if, while reconstructing D0, Device B fails, D0 is not lost since C-D0 in Device C may still be decompressed. This differs from prior parity protection techniques which requires access to both Device B and Device C to reconstruct D0 (e.g. to solve D0 from an equation having D1 and the XOR of D0 and D1). In those parity techniques, if Device B fails during reconstruction, D0 is lost (similar to how an equation with two unknowns cannot be solved). In the embodiment of FIG. 7A (as well as FIGS. 6A and 6B), D0 is recoverable even if Device B fails during reconstruction.

Figure 7B:
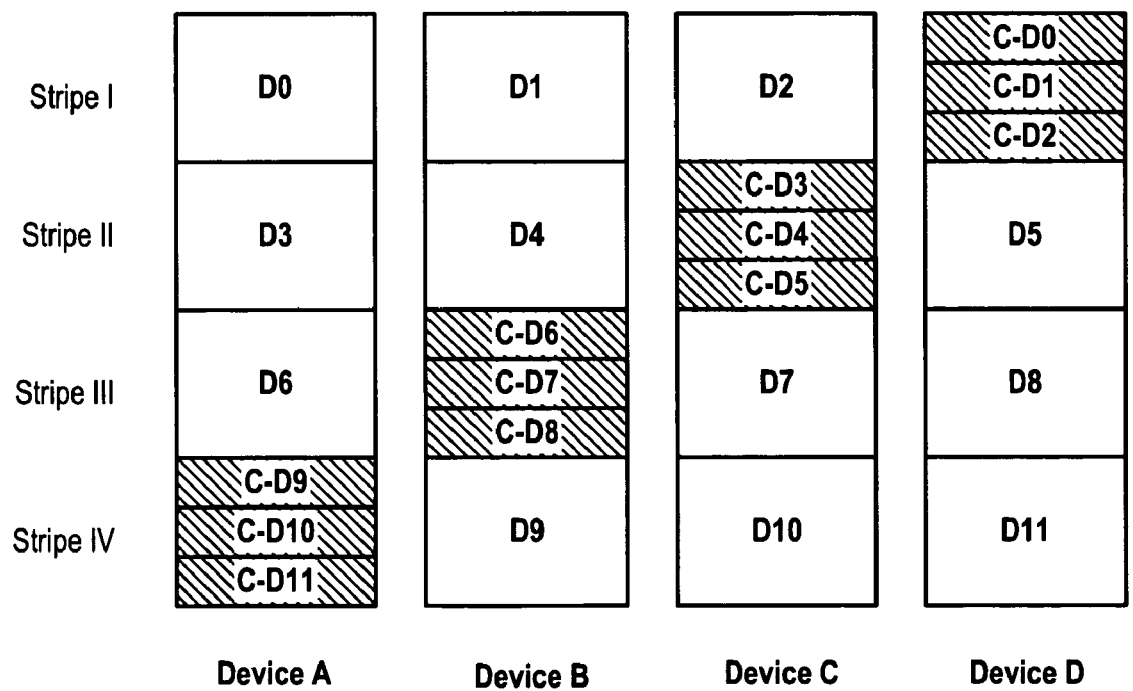

FIG. 7B shows an array of four storage devices, Device A-Device D. Similar to the embodiment of FIG. 7A, the protection blocks are distributed across the array. In the embodiment of FIG. 7B, however, the data blocks (e.g. D0 thru D2) are compressible into blocks one-third of the original (uncompressed) data blocks. Therefore, in FIG. 7B, a more efficient compression algorithm may be used than in the embodiment of FIG. 7A.

Figure 7C:
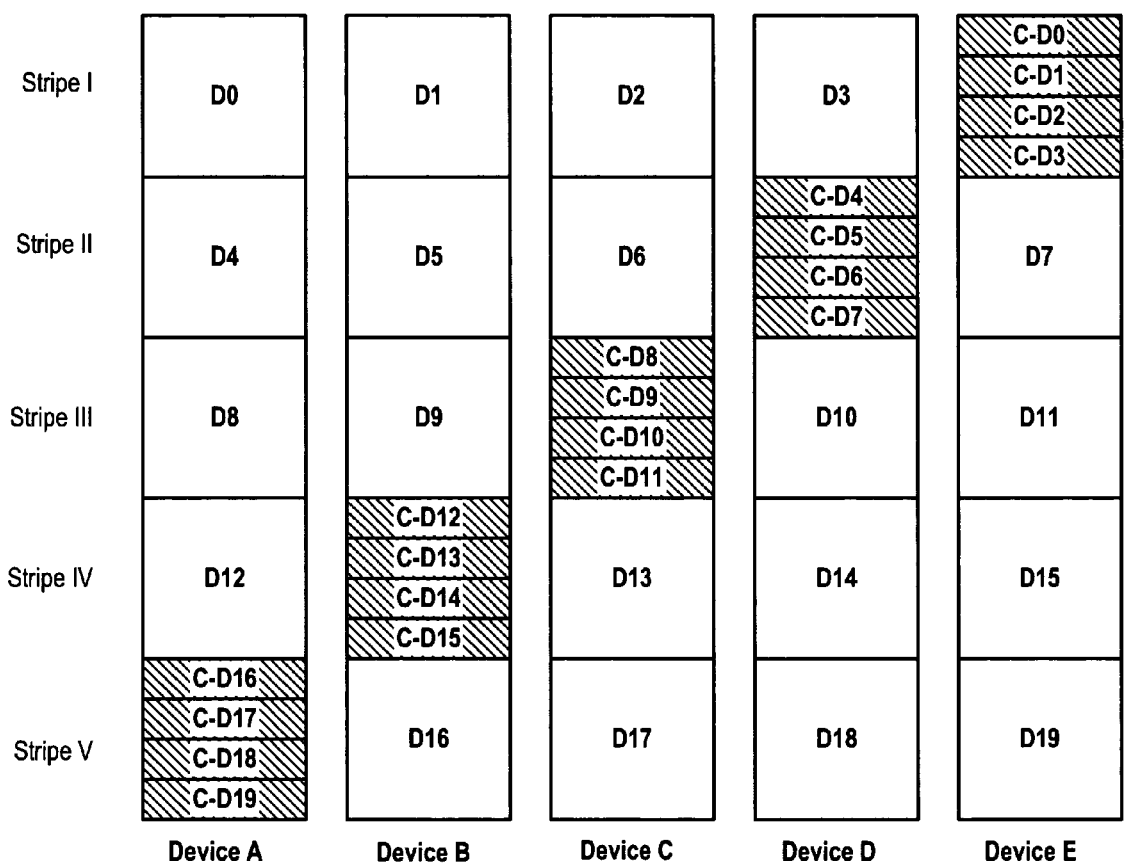
Figure 8:
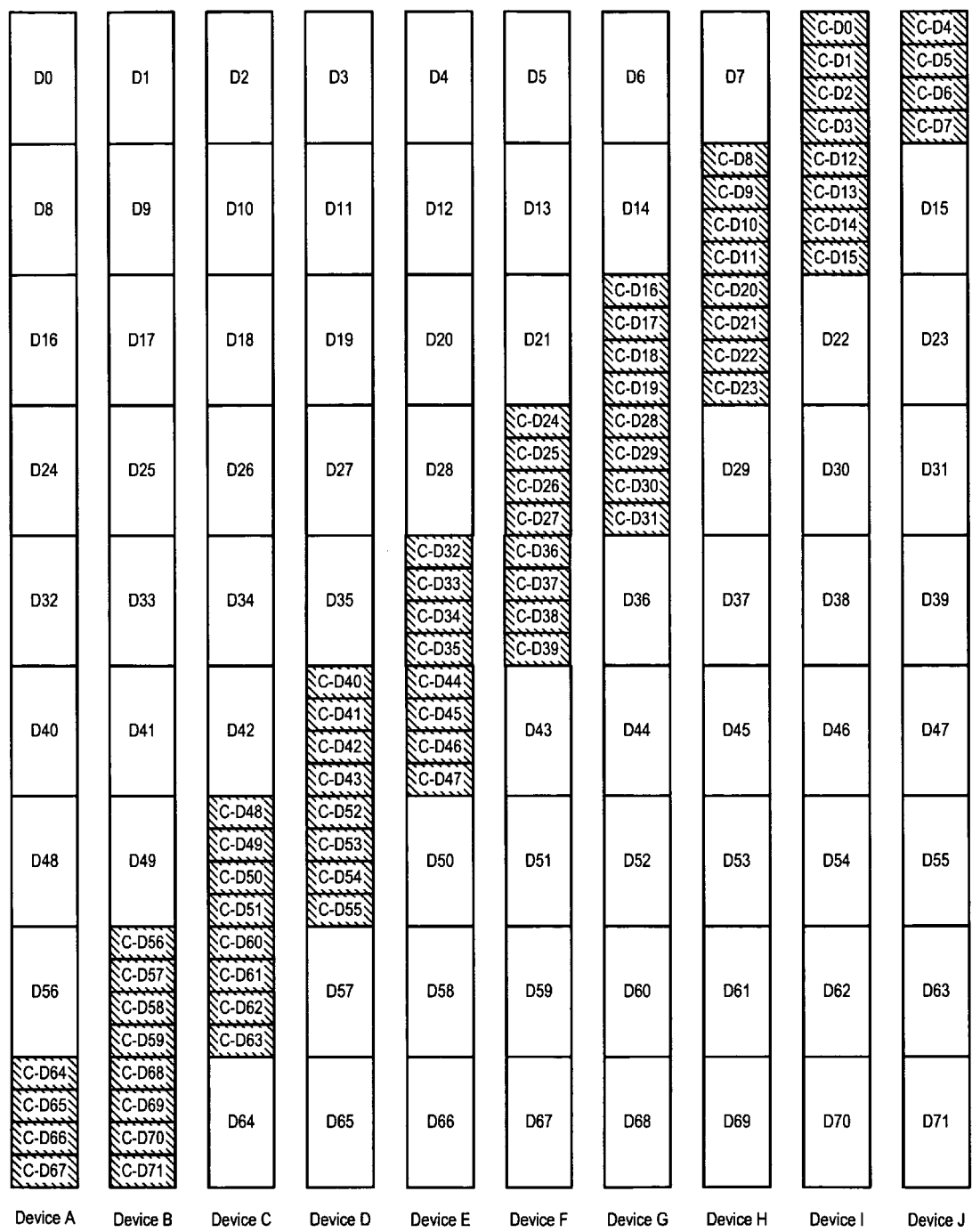
FIG. 8 shows an arrangement of blocks, including protection blocks divided among two storage devices in a stripe and distributed across an array of ten storage devices, in accordance with one embodiment of the invention.

FIG. 7C shows an array of five storage devices, Device A-Device E. As can be seen by comparing FIG. 7A thru FIG. 7C, arrays having more storage devices may require greater data compression. In the embodiment shown in FIG. 7C, the data blocks D0 thru D3 are each compressed to one-fourth (¼) their original size. Therefore, to use the compression scheme in FIG. 7C, each 4 Kbyte data block compresses to 1 Kbyte, for example. As the number of devices in an array increase, compression of the data blocks may become difficult. One solution to this issue may be through the use of two protection blocks per stripe, rather than one. FIG. 8 shows such an embodiment.

FIG. 8 shows an array of ten storage devices, Device A-Device J. Each stripe has available two protection blocks on two separate devices to store the compressed data. Therefore, in the embodiment shown, a data block may be compressed less efficiently than in previous embodiments. For example, in this embodiment, data block D0 may be stored compressed to one-fourth (¼) its size, rather than one-eight (⅛) its size, as may be required in an embodiment similar to that of FIG. 7C. This variation may allow larger arrays to use compression to protect data. A data block is recoverable so long as the device on which the corresponding compressed data is located is accessible. Therefore, failure of a device having protection blocks may render a portion of a stripe unrecoverable in the event of a second failure but not the entire stripe.

Additionally, in embodiments in which the compressed data blocks are to be stored in equal sizes (e.g. in FIG. 6A), rather than in potentially unequal sizes (e.g. in FIG. 6B), use of multiple protection blocks may be particularly useful when the number of data blocks in the stripe is a multiple of the number of protection blocks in the stripe. For example, when eight data blocks are protected by two protection blocks (e.g. as in FIG. 8), neither of the two protection blocks will contain extraneous, unused storage space. Similarly, when nine data blocks are protected by three protection blocks, none of the three protection blocks will contain extraneous, unused storage space.

Figure 9:
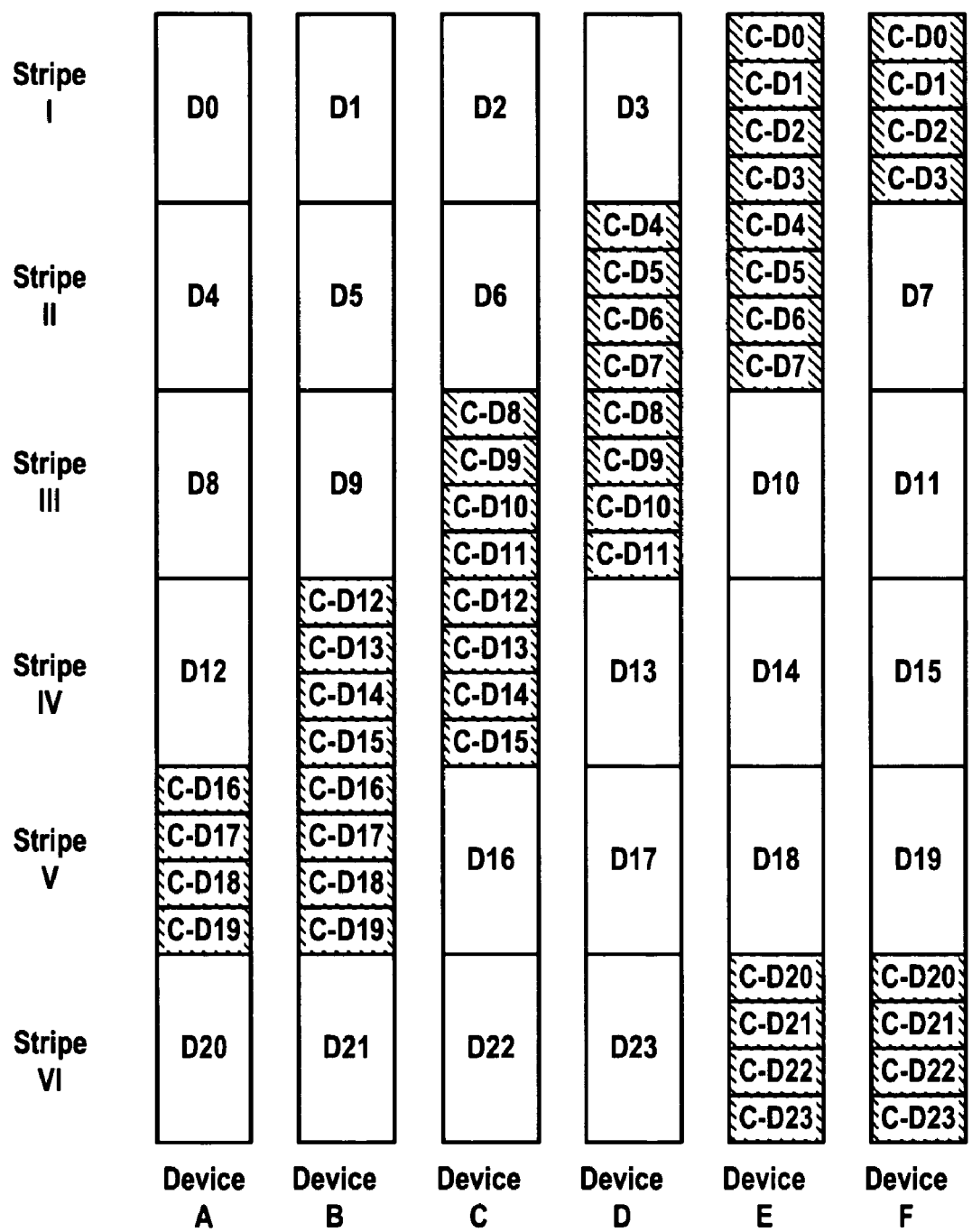
FIG. 9 shows an arrangement of blocks, including distributed and mirrored protection blocks, in accordance with one embodiment of the invention.

FIG. 9 shows another embodiment of the invention using two protection blocks per stripe. However, in the embodiment of FIG. 9, the second protection block contains a duplicate (or mirror) of the first protection block. Therefore, as long as one of the drives containing compressed data is accessible, data will not be lost. For example, if devices A, B, C and E fail, data in Stripes I and VI may still be recovered using Device F and data in Stripes II and III may still be recovered using Device D.

In the above examples, data blocks (e.g. D0) may be compressed using hardware (including a dedicated circuit), software, or a combination thereof. Additionally, various compression algorithms may be used, alone or in combination, to achieve a desired compression. These algorithms include, but are not limited to, algorithms based on run length encoding (RLE), dictionary coders (also known as substitution coders), Burrows-Wheeler transform, bzip2, prediction by partial matching (PPM), context mixing (e.g. PAQ), entropy encoding and linear predictive coding. Examples of algorithms based on RLE include PackBits, PCX or InterLeaved BitMap (ILBM). Examples of algorithms based on dictionary coders include Lempel-Ziv 77 (LZ77), Lempel-Ziv 88 (LZ88), DEFLATE, Lempel-Ziv-Welch (LZW), Lempel-Ziv-Markovchain-Algorithm (LZMA) and Lempel-Ziv-Oberhumer (LZO). Examples of algorithms based on entropy encoding include Huffman coding, Golomb coding, arithmetic coding and range encoding. Examples of algorithms based on linear predictive coding include True Audio (TTA) and Free Lossless Audio Codec (FLAC). The above algorithms are examples of lossless data compression algorithms. It shall be appreciated, however, that although lossy data compression algorithms (e.g. discrete cosine transform, fractal compression and wavelet compression) will usually not be desirable, certain scenarios may tolerate a non-exact reconstruction of the data, and therefore such algorithms are within the scope of this invention.

Additionally, the algorithm(s) used may vary depending on the embodiment and the type of data being stored. Generally, the algorithm(s) used will be determined when designing or configuring operating system 24, and therefore predetermined when the data is received for storage. However, certain embodiments may determine the algorithm(s) dynamically depending on the type of data received in real-time.

Process

In the embodiments shown in FIGS. 6A-FIG. 9, each stripe is protected using compression. However, as previously noted, in certain embodiments, a compressed version of a data block may be larger than a storage space available in a protection block. In those situations, the stripe may be protected using a parity protection scheme, e.g. storing an XOR of the data blocks in the stripe in the protection block rather than compressed versions of the data blocks.

Figure 10:
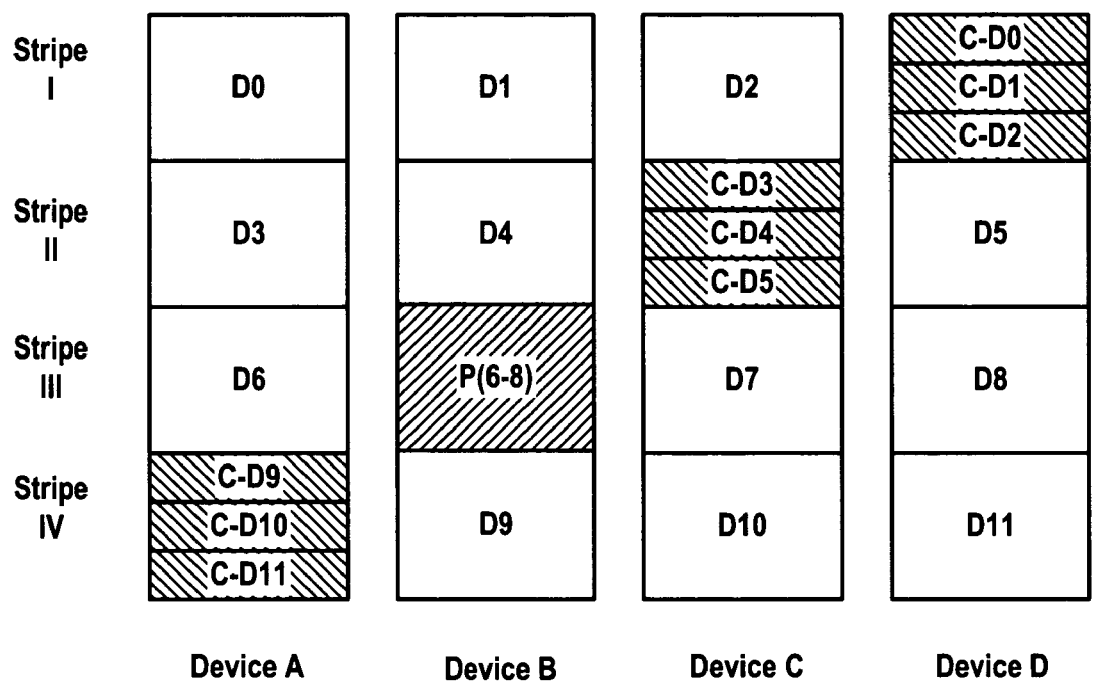
FIG. 10 shows an arrangement of blocks in an array protected by both compression and parity schemes in accordance with one embodiment of the invention.

For example, in FIG. 10, a data block in Stripe III (e.g. D6, D7 or D8) may not be compressible to a size that is one-third of a data block (e.g., compressible to approximately 1.3 Kbyte for a 4 Kbyte block). Therefore, Stripe III is protected using a parity P(6-8), which may be an XOR of data blocks D6 thru D8, for example. In the embodiment shown in FIG. 10, the parity data is stored in the protection block where compressed data would otherwise be stored. In other embodiments, the parity may be stored in a different block. In FIG. 10, if Device A fails, Devices B-D are accessed to recover D6. If Device B fails while Device A is inaccessible, D6 and D9 will be lost, but all data blocks in Stripe I and II are still retrievable. If, while Device A is inaccessible, Device C fails instead of Device B, then D6, D7 and D10 may be lost, but again all data blocks in Stripe I and II are still retrievable.

To track the type of protection scheme used to protect a stripe, several techniques may be used, alone or in combination. For example, in certain embodiments, a map may be stored indicating the protection scheme used to protect a stripe. For example, a map corresponding to the arrangement shown in FIG. 10 may indicate that Stripes I, II and IV are protected using compression and that Stripe III is protected using parity. The map may be stored in many formats including, but not limited to, a table, an array, a comma-delineated list, a tab-delineated list, or the like. Additionally, the map may be stored in various locations, e.g. file system layer 31 or storage access layer 34. The map may be saved in nonvolatile as well as volatile memory.

In other embodiments, alternatively or in addition to a map, a checksum area of each stripe may keep a bit to indicate the protection method used. The checksum may be included in a metadata field that is appended to the end of a block when the block is stored.

When a data block (e.g. D0) is received by the storage access layer 34 to be written, the new data may not be sufficiently compressible. Therefore, a stripe that may have been previously protected using compression may now need to be protected using another scheme, e.g. RAID-5. In such situations, the data block (e.g. D0) may be written and the compressed data currently in a protection block (e.g. C-D0, C-D1 and C-D2 in FIG. 10) may be overwritten with parity data (e.g. an XOR of new D0 and prior D1 and D2). The map, checksum and/or other tracking technique is then updated to reflect this change in protection schemes.

When an error occurs (e.g. a failed disk in the array), the storage access layer 34 may access the map, checksum, or another tracking technique used, alone or in combination, to determine how to recover the missing data. For example, the storage access layer 34 may extract the bit used to indicate the protection method from the metadata field. This bit may be analyzed to determine that Stripe III in the embodiment of FIG. 10 is protected using parity data. In other embodiments, the storage access layer 34 may pass the extracted bit up to the file system 31 to do the analysis.

Following the determination, the data block may be reconstructed and written back to the disk. For example, if the stripe is protected using compression, the storage access layer 34 may extract the compressed data from a corresponding protection block, decompress the data, and write the decompressed data back to the disk. Alternatively, the storage access layer 34 may pass the compressed data to up to the file system 31 for decompression. The file system 31 may then send the decompressed data back to the storage access layer 34 to be written to the disk.

FIG. 11 shows a flow chart of a process for writing data to storage in accordance with one embodiment of this invention. Specifically, FIG. 11 illustrates a process for writing the data blocks shown in the embodiment of FIG. 10. The process starts at 100. At 102, a data block (e.g. D0) is received for storage in Stripe I.

In certain embodiments, once the data block is received, the storage access layer 34 may determine at 104 which protection scheme (e.g. RAID-C or RAID-5) currently protects data in the stripe. As previously noted, whether a stripe to which a data block is to be written is currently protected by a parity or compression protection scheme may be a predetermined criterion which determines whether a compressed version of the data is written to the protection block.

In other embodiments or situations, the storage access layer 34 may not determine which protection scheme currently protects data in the stripe. For example, in a full stripe Write situation, a stripe's current protection scheme may be irrelevant. Additionally, in certain embodiments, the resources used to determine if a data block can be sufficiently compressed to fit into a protection block for a Write operation may be small. It may, therefore, be acceptable to determine if a data block can be sufficiently compressed each time a data block is received.

If compression is used (e.g. RAID-C), then at 106, the storage access layer 34 determines if the data block can be sufficiently compressed to fit into a protection block (i.e. satisfies a predetermined compressibility criterion). In this case, the data block (e.g. D0) should be compressible to ⅓ of its size to fit into the protection block in Device D (as shown in FIG. 10 by C-D0). This predetermined compressibility criterion (i.e. compressible to ⅓ of the data block) may be predetermined by the ratio of the number of devices in the stripe available for data relative to the number of devices in the stripe available for protection (e.g. 3:1).

In other embodiments, the compressibility criterion may be predetermined by the amount of space in the protection block currently used by other compressed data. For example, in FIG. 6B, the compressibility criterion may be predetermined by the C-D1. That is, the predetermined compressibility criterion may be that the data block should be compressible to a size less than or equal to the size of the total protection block minus the size of C-D1, which was previously stored in the protection block.

If the data block can be sufficiently compressed, then at 108, the data block is written to Stripe I and the compressed version is written to the protection block in Stripe I. The data block and its corresponding compressed version may be written in parallel or sequentially.

At 110, Stripe I is correlated with the compression protection scheme in a map, checksum and/or other tracking technique. In certain embodiments, the map, checksum and/or other tracking technique is read to determine if an appropriate mapping already exists, and then written or modified as necessary to ensure the appropriate mapping. In other embodiments, the map, checksum and/or other tracking technique is written without a Read. This latter technique may be beneficial if the Write operation for the map, checksum and/or other tracking technique has a relatively small overhead such that an unnecessary Write is acceptable. The Write of the data block received at 102 is complete at 120.

If, at 104, a determination is made that Stripe I is already protected using parity (e.g. by using the map previously discussed), then at 112, the data block received at 102 is written to Stripe I. A parity of Stripe I with the new data is determined. The new parity data is then written to the protection block. This process allows an embodiment of the invention to avoid expending resources determining whether a data block may be sufficiently compressed when another data block in the Stripe already precludes using compression as a protection scheme.

For example, in the embodiment of FIG. 10, if Stripe III is protected by parity because block D6 cannot be sufficiently compressed to fit into a protection block, then, when writing block D7, a determination as to whether block D7 can be sufficiently compressed unnecessarily expends resources. In such a case, the determination at 104 avoids such unnecessarily resource expenditures.

Even in embodiments without the operation at 104, if a determination is made at 106 that the data block cannot be adequately compressed, then the process will continue at 112 where the data block is written and parity data is calculated and stored.

At 114, Stripe I is correlated with the parity protection scheme in the map, checksum and/or other tracking technique. In certain embodiments, the map, checksum and/or other tracking technique is read to determine if an appropriate mapping already exists. If the Stripe was previously associated with compression, then the other devices in the array (e.g. Device B and C) may also need to be accessed to calculate the parity data. If the Stripe was previously associated with parity, then the other devices in the array may not need to be accessed to update the parity data. The Write of the data block received at 102 is again complete at 120.

As can be understood by considering FIG. 11, over time, one or more data blocks that preclude a Stripe from being protected by a compression protection scheme may be overwritten. Eventually, the Stripe protected by the parity scheme may be protectable by a compression scheme, i.e. the Stripe may consist entirely of data blocks which may be sufficiently compressed. In certain embodiments, this type of Stripe, or this status of a Stripe, may be detected, and the protection scheme for the Stripe converted to a compression protection scheme.

For example, during a background scan to verify parity or to check for media defects, a Stripe which is protected by a parity protection scheme may be analyzed. The analysis may indicate that all data blocks in the Stripe may be sufficiently compressed. As a result, the data blocks in the Stripe may be compressed and the parity in the protection block(s) may be replaced by compressed versions of the data blocks.

This conversion to the compression protection scheme may be independent of or part of the background scan. For example, the results of the analysis may be transmitted to another software component, which may check for a certain criterion before conversion occurs. For example, the software component may request for verification from a user, or wait until a certain number of Stripes can be converted before initiating the conversion. The analysis may also be initiated independent of other processes, e.g. independent of background or maintenance scans.

FIG. 12 shows a flow chart of a process for recovering data in accordance with one embodiment of this invention when a storage device in an array of storage devices fails. Specifically, FIG. 12 illustrates a process for reconstructing a data block that fails in the embodiment of FIG. 10. The process starts at 200.

At 202, a faulty block is identified. This block may be identified when a Read operation on the faulty block is attempted and fails. In another embodiment, the faulty block may be identified when a failed drive is replaced and the system reconstructs the failed drive, block by block.

At 204, the scheme (e.g. compression or parity) used to protect the stripe having the faulty block is determined. A map, checksum and/or other tracking technique, such as that previously described, may be analyzed, for example, to determine that the faulty block is part of a stripe that is protected using compression. If so, the process continues at 206.

At 206, a protection block containing the corresponding compressed data is identified. For example, in the embodiment of FIG. 10, if D0 is the faulty block, then the protection block on Device D is identified. In the embodiment of FIG. 9, the protection block on either Device E or F may be identified. In certain embodiments, whichever Device E or F is available is used. For example, if Device E is otherwise unavailable (e.g. Device E is currently being using in a separate Read operation or has failed), Device F may be used to reconstruct the faulty block. In the embodiment of FIG. 8, if D0 is the faulty block, then the protection block on Device I is identified. In such an embodiment, the map, checksum and/or other tracking technique may identify both the scheme used to protect the stripe (e.g. compression or parity) and the device used to store specific compressed data blocks (e.g. Device I used to store C-D0 and Device J used to store C-D4 in FIG. 8). In other embodiments, a map may identify the scheme used to protect a stripe while a checksum and/or other technique identifies the device used to store specific compressed data blocks, or vice versa.

At 208, the compressed data in the identified protection block is read. In certain embodiments, the entire block may be read, and then the compressed data extracted. In certain embodiments, the portion of a protection block containing the relevant compressed data may be read rather than the entire protection block. For example, if the compressed data is C-D0, the first third of the protection block may be read without reading the latter two-thirds of the block. This way, the read may be completed more quickly.

At 210, the compressed data is decompressed. In certain embodiments, the decompression occurs in the storage access layer 34. In other embodiments, the compressed data is passed up to the file system layer 31. The decompression may then occur in the file system layer or some other layer. In certain embodiments, the same or similar hardware and/or software used to compress the data is also used to decompress the data. For example, an add-in card or application specific integrated circuit (ASIC) may be used to both compress and decompress data.

At 212, the decompressed data is written to the storage device. Reconstruction of the faulty block is then complete at 230.

If, at 204, the faulty block is determined to be in a stripe protected using parity, the process of reconstructing the faulty block continues at 220. In the embodiment of FIG. 10, for example, if the faulty block is D6, analysis of a map, checksum and/or other tracking technique can reveal that D6 is part of a stripe protected using parity.

At 220, a protection block containing the corresponding parity data is identified. In the embodiment of FIG. 10, for example, the protection block on Device B would be identified. This parity data is read at 222.

At 224, all other data blocks are read. As previously discussed, under a parity protection scheme, the other data blocks in the stripe, including the parity block, are used to reconstruct the missing block. Therefore, in the embodiment of FIG. 10, Devices C and D are accessed to read data blocks D7 and D8.

At 226, the faulty block is reconstructed using the read parity data and all other data blocks in stripe (e.g. Stripe III in FIG. 10). When the parity data is an XOR of the data blocks in the stripe, the faulty block may be reconstructed by performing an XOR operation on all of remaining (non-faulty) blocks in the stripe, including the parity block. For example, in the embodiment of FIG. 10, if D6 is the faulty block, an XOR of P(6-8), D7, D8 and will result in D6. This is because of a known property of the XOR operation, in which if X=A XOR B, then X XOR B=A and A XOR X=B.

At 228, the reconstructed block is written to storage device. Reconstruction of the faulty block is then complete at 230.

Thus, a method and apparatus for protecting data in a storage system using compression is described. In the above detailed description, numerous specific details are set forth in order to provide a thorough understanding of the present invention. However, it will be apparent to one of ordinary skill in the art that these specific details need not be used to practice the present invention. In other circumstances, well-known structures, materials, or processes have not been shown or described in detail so as not to obscure the present invention.

Although the present invention, for purpose of explanation, has been described with reference to specific exemplary embodiments, it will be recognized that the invention is not limited to the embodiments described, but can be practiced with modification and alteration within the spirit and scope of the appended claims.

Moreover, non-dependent acts may be performed in parallel. The embodiments were chosen and described in order to best explain the principles of the invention and its practical applications, to thereby enable others skilled in the art to best utilize the invention and various embodiments with various modifications as are suited to the particular use contemplated.

Furthermore, the use of the phrase "one embodiment" throughout does not necessarily mean the same embodiment. Although these particular embodiments of the invention have been described, the invention should not be limited to these particular embodiments. Accordingly, the specification and drawings are to be regarded in an illustrative sense rather than a restrictive sense.

Unless specifically stated otherwise, it is to be appreciated that throughout the discussions utilizing terms such as "processing" or "computing" or "calculating" or "determining" or "displaying" or the like refer to the action and processes of a computer system or similar electronic computing device that manipulates and transforms data represented as physical (e.g. electronic) quantities within the computer systems registers and memories into other data similarly represented as physical quantities within the computer system.

The present invention can be implemented by an apparatus for performing the operations herein. This apparatus may be specially constructed for the required purposes or it may comprise a machine such as a general purpose computer selectively activated or reconfigured by a computer program (such as a collection of instructions for execution by a machine or processor for example) stored in the computer. Such a computer program may be stored in a computer readable storage medium such as but not limited to any type of disk including floppy disks, optical disks, magnetic optical disks, read only memories, random access memories, EPROMS, EEPROMS, magnetic or optical cards or any type of media suitable for storing physical (e.g. electronic) constructions and each coupled to a computer system bus. Each of these media may be coupled to a computer system bus through use of an appropriate device for reading and or writing the media in question. Specialty apparatus may include a collection of readily available pieces or an application specific integrated circuit (ASIC) including a series of logic blocks, for example.

The method of the invention may be implemented using computer software. If written in a programming language conforming to a recognized standard sequence of instructions, the methods can be compiled for execution on a variety of hardware platforms or machines and for interface to a variety of operating systems. In addition the present invention is not described with reference to any particular programming language. It will be appreciated that a variety of programming languages may be used to implement the teachings of the invention as described herein.

What is claimed is:

1. A computer-implemented method comprising:
   writing a plurality of data blocks in a stripe, wherein the stripe spans a plurality of physical storage devices;
   for each data block of the plurality of data blocks, writing a compressed version of the data block to a protection block, wherein the protection block is located on a different physical storage device than a storage device storing the data block; and
   recovering the data block using the compressed version of the data in the protection block.

2. The computer-implemented method of claim 1, wherein writing the compressed version is in response to a determination that the data block can be compressed to fit within the protection block.

3. The computer-implemented method of claim 1, further comprising reducing the number of reads of another data block in the stripe associated with writing the data block.

4. The computer-implemented method of claim 1, wherein the data block is recovered using the compressed version of the data in the protection block in response to failure of the data block and another block in the stripe.

5. The computer-implemented method of claim 1, wherein writing the compressed version to the protection block is in response to determining that a size of the compressed version is less than or equal to a size of the protection block and the method further comprises:
   writing parity data to the protection block when the size of the compressed version is greater than the size of the protection block;
   associating the stripe with a first type of protection scheme when the compressed version is written to the protection block; and
   associating the stripe with a second type of protection scheme when the parity data is written to the protection block.

6. The computer-implemented method of claim 5, wherein the second type of protection scheme is a parity protection scheme in accordance with at least one of: RAID-4, RAID-5, RAID-6 and RAID Double Parity (RAID-DP).

7. The computer-implemented method of claim 5, wherein associating the stripe with the first type of protection scheme comprises writing to a map or a checksum area in the stripe.

8. The computer-implemented method of claim 5, further comprising:
   receiving a request to write a second data block in the stripe;
   determining a size of a compressed version of the second data block; and
   when the size of the compressed version of the second data block is greater than the size of the protection block, writing parity data to the protection block and re-associating the stripe with the second type of protection scheme when the stripe was previously associated with the first protection scheme.

9. A storage server, comprising:
   a client interface through which to communicate with one or more clients;
   a storage interface through which to communicate with an array of storage devices;
   a processor to execute file system operations for data stored in the array of storage devices; and
   a memory storing instructions which, when executed by the processor, cause the storage server to perform a set of operations, including:
      writing a plurality of data blocks in a stripe across an array of storage devices;
      when each data block in the plurality of data blocks is compressible according to a predetermined compressibility criterion, writing a compressed version of each data block to a protection block on one of the storage devices which does not contain the plurality of data blocks; and
      when one data block in the plurality of data blocks is not compressible according to the predetermined compressibility criterion, writing a parity of the stripe to the protection block.

10. The storage server of claim 9, further comprising updating a map containing correlations between data stripes and types of protection schemes.

11. The storage server of claim 9, further comprising writing a bit to a checksum area of the stripe to indicate a type of protection scheme to be associated with the stripe.

12. The storage server of claim 9, wherein the protection block is duplicated on another storage device in the array of storage devices which does not contain the plurality of data blocks.

13. The storage server of claim 9, wherein the compressed versions of the plurality of data blocks are distributed across a plurality of storage devices.

14. The storage server of claim 9, further comprising:
   writing a second plurality of data blocks in a second stripe across the array of storage devices;
   when each data block in the second plurality of data blocks is compressible according to a predetermined compressibility criterion, writing a compressed version of each data block in the second plurality to a second protection block in one of the storage devices which does not contain the first protection block or the second plurality of data blocks; and
   when one data block in the second plurality of data blocks is not compressible according to the predetermined compressibility criterion, writing a parity of the second stripe to the second protection block.

* * * * *